(12) United States Patent
Platzgummer (10) Patent No.: US 8,026,495 B2
(45) Date of Patent: Sep. 27, 2011

(54) CHARGED PARTICLE BEAM EXPOSURE SYSTEM

(75) Inventor: Elmar Platzgummer, Vienna (AT)

(73) Assignee: Carl Zeiss SMS GmbH, Jena (DE)

( * ) Notice: Subject to any disclaimer, the term of this patent is extended or adjusted under 35 U.S.C. 154(b) by 231 days.

(21) Appl. No.: 12/090,632

(22) PCT Filed: Oct. 28, 2005
(Under 37 CFR 1.47)

(86) PCT No.: PCT/EP2005/011593
§ 371 (c)(1),
(2), (4) Date: Feb. 5, 2009

(87) PCT Pub. No.: WO2007/048433
PCT Pub. Date: May 3, 2007

(65) Prior Publication Data
US 2009/0212240 A1    Aug. 27, 2009

(51) Int. Cl.
*H01J 37/04* (2006.01)
(52) U.S. Cl. ............... 250/492.22; 250/492.3
(58) Field of Classification Search .............. None
See application file for complete search history.

(56) References Cited

U.S. PATENT DOCUMENTS

| | | | |
|---|---|---|---|
| 4,985,635 A | 1/1991 | Inokuti et al. | |
| 5,260,579 A | 11/1993 | Yasuda et al. | |
| 5,262,341 A | 11/1993 | Fueki et al. | |
| 5,359,202 A | 10/1994 | Yasuda et al. | |
| 5,369,282 A | 11/1994 | Arai et al. | |
| 5,448,075 A | 9/1995 | Fueki et al. | |
| 5,801,388 A | 9/1998 | Stengl et al. | |
| 5,920,077 A | 7/1999 | Oae et al. | |
| 6,326,632 B1 | 12/2001 | Buschbeck et al. | |
| 6,486,479 B1 * | 11/2002 | Oae et al. | 250/492.2 |
| 6,703,624 B2 * | 3/2004 | Hamaguchi et al. | 250/492.2 |
| 6,768,125 B2 | 7/2004 | Platzgummer et al. | |
| 6,958,804 B2 * | 10/2005 | Wieland et al. | 355/67 |
| 7,084,411 B2 | 8/2006 | Lammer-Pachlinger et al. | |
| 7,368,738 B2 * | 5/2008 | Platzgummer | 250/492.23 |
| 2003/0155534 A1 * | 8/2003 | Platzgummer et al. | 250/492.22 |
| 2005/0087701 A1 | 4/2005 | Lammer-Pachlinger et al. | |

FOREIGN PATENT DOCUMENTS

| | | |
|---|---|---|
| GB | 2389454 B | 12/2003 |
| GB | 2408383 A | 5/2005 |
| GB | 2412232 A | 9/2005 |
| GB | 2413694 A | 11/2005 |
| JP | 61069125 | 4/1986 |
| JP | 7273006 | 10/1995 |

(Continued)

OTHER PUBLICATIONS

Notification of Reasons for Rejection dated Sep. 27, 2010 in Patent Application JP 2005-134248 (2 pages), with English-language translation (3 pages).

(Continued)

*Primary Examiner* — Robert Kim
*Assistant Examiner* — David Smith
(74) *Attorney, Agent, or Firm* — Bruce D. Riter (57) ABSTRACT

A charged particle beam exposure system has a blanking aperture array (31) having groups of apertures (53) controlled by shift registers (75), wherein different inputs (C) to the shift registers influence a different number of apertures. Charged particle beamlets traversing the apertures are scanned across a charged particle sensitive substrate in synchronism with a clock signal of the shift registers.

17 Claims, 6 Drawing Sheets

FOREIGN PATENT DOCUMENTS

| | | |
|---|---|---|
| JP | 2004 040076 | 2/2004 |
| WO | WO 2007/048433 A1 | 5/2007 |

OTHER PUBLICATIONS

I. Berry et al., Programmable Aperture Plate for Maskless High-Throughput Nanolithography, J. Vac. Sci. Technol. B 15, 1997, pp. 2382-2386, US.

M. Muraki et al., New Concept for High-Throughput Multielectron Beam Direct Wire Sytem, J. Vac. Sci. Technol. B 18(6), 2000, pp. 3061-3066, US.

UK Search Report from GB 0508660.8, Aug. 2, 2005, Carl Zeiss SMS GmbH.

International Search Report from PCT/EP2005/011593, Aug. 4, 2006, Carl Zeiss SMS GmbH.

* cited by examiner

CHARGED PARTICLE BEAM EXPOSURE SYSTEM

CROSS REFERENCE TO RELATED APPLICATIONS

This application is a National Stage application of International Application No. PCT/EP2005/011593, filed Oct. 28, 2005, which designates the United States and was published in English, and is incorporated herein in its entirety by reference.

BACKGROUND OF THE INVENTION

1. Field of the Invention

The present invention relates to a charged particle beam exposure system used, for example, in a lithographic method.

2. Brief Description of Related Art

Lithographic processes are commonly used in the manufacture of miniaturized structures, such as semiconductor elements, integrated circuits, liquid crystal elements, micro-patterned members and micro-mechanical components.

A lithographic process comprises a plurality of lithographic steps in which patterns or structures to be formed on a substrate are imaged onto the substrate to expose a radiation sensitive layer provided on the substrate. The radiation sensitive layer, which is commonly referred to as a resist, may be exposed by optical radiation, such as visible or ultraviolet light, or by charged particles, such as ions or electrons. In the imaging of patterns using charged particles, a conventional method uses a plurality of charged particle beams or beamlets for writing the pattern onto the resist, wherein the beams or beamlets can be selectively switched on and off while the substrate carrying the resist is moved relative to the array of switchable beams.

The switchable beams are controlled by a deflector plate having a plurality of apertures traversed by the beams. Each aperture has a deflector associated therewith for selectively deflecting the beam traversing the aperture by a sufficient angle such that the beam will not reach the substrate carrying the resist. Such type of multi-aperture plate is also referred to as a blanking aperture plate (BAA) in the art. Background information on charged particle beam exposure systems using a plurality of charged particle beams controlled by a blanking aperture array may be obtained from US 2003/0025088 A1, the contents of which are incorporated herein by reference.

It is desirable to obtain a high through-put in terms of number of wafers exposed per hour. This number is limited by an available charged particle beam current for exposing locations on the wafer with an exposure dose above a threshold of the resist. However, the maximum current per exposing beam is limited due to Coulomb interactions and other effects deteriorating a maximum resolution of an exposed pattern.

A conventional system disclosed in U.S. Pat. No. 5,144,142 and the article of Berry et al., J. Vac. Sci. Technol. B 15.6., November/December 1997 0734-211X/97/15.6./2382/5/$10.00 ©1997 American Vacuum Society, pages 2382 to 2386, uses massively parallel beams for exposing each location on the wafer to achieve a necessary exposure dose with a relatively low current per individual beam. A plurality of apertures is disposed along a line on the blanking aperture plate, and the deflectors associated with the apertures are driven by outputs of stages of a shift register. An exposure pattern supplied to an input of the shift register is shifted in accordance with a clock signal, resulting in that a pattern of exposing beams will be translated across an image plane of the system. The wafer is moved in synchronism with the translating pattern such that each location on the wafer to be exposed receives a number of exposures from individual beams corresponding to the number of apertures in the line connected to the shift register. Other locations on the wafers which are not to be exposed will not receive any exposure dose.

It has been found that the conventional system using the apertures disposed in a line and controlled by stages of a shift register provide limited flexibility in providing exposure patterns suitable for manufacturing desired structures in the lithographic process.

SUMMARY OF THE INVENTION

The present invention has been accomplished taking the above problems into consideration.

Embodiments of the present invention provide a charged particle beam system comprising: a multi-aperture plate with a plurality of apertures, wherein groups of apertures are disposed along a line on the multi-aperture plate; a plurality of beamlet manipulating electrodes, wherein each aperture has at least one beamlet manipulating electrode associated therewith for modulating a beamlet traversing the aperture; and a control system comprising a plurality of shift registers, wherein the at least one beamlet manipulating electrode of each aperture is controlled by at least one stage of the shift registers in dependence of an output state of this stage, wherein the apertures of the group of apertures disposed along a line are controlled in dependence of plural inputs supplied to at least one shift register, and wherein a number of apertures of the group controlled in dependence of a respective input is different from one input to another input.

Thus, it is possible to determine an exposure dose based on a selection of the inputs to which an exposure signal is supplied. Since different inputs influence a different number of apertures, the number of apertures involved in an exposure process can be adjusted via suitable selection of the inputs.

Other than in the conventional system, it is not necessary that all apertures of the group of apertures disposed along a line are involved in the exposure process. The number of apertures involved in the exposure process according to the illustrated embodiment can be selectively reduced such that an exposure dose can be adjusted.

According to an exemplary embodiment, a charged particle beam system comprises: a charged particle source for generating at least one beam of charged particles; a multi-aperture plate having a plurality of apertures; charged particle optics configured to direct beamlets of charged particles traversing the apertures of the multi-aperture plate onto a charged particle sensitive substrate; a plurality of beamlet manipulating electrodes, wherein each aperture has at least one beamlet manipulating electrode associated therewith for modulating the beamlet traversing the aperture; and a control system comprising a plurality of shift registers, each shift register having at least one input and plural stages, wherein the at least one beamlet manipulating electrode of each aperture is controlled by at least one stage of the shift registers in dependence of an output state of the at least one stage; wherein each input has a group of stages associated therewith, wherein the output states of only the stages of the group of stages are dependent on states of the respective input; wherein the plurality of apertures comprises plural groups of apertures, wherein the apertures of each group of apertures are disposed on the multi-aperture plate along a straight line; wherein the electrodes of the apertures of each group of apertures are controlled by stages of plural groups of stages, wherein a number of apertures having electrodes controlled by a first group of the plural groups of stages differs from a number of apertures having electrodes controlled by a second group of the plural groups of stages.

According to an exemplary embodiment, the number of apertures having electrodes controlled by the first group of stages is greater than five times the number of the apertures having electrodes controlled by the second group of stages. Such great difference between the number of apertures controlled by two different inputs may allow for a great range of exposure doses applied to locations on a wafer.

According to an exemplary embodiment, the number of the apertures having electrodes controlled by one group of stages is an integer multiple of a power of two.

According to a further exemplary embodiment, the electrodes of the apertures of the group of apertures are controlled by only one group of stages.

According to a further exemplary embodiment, each shift register has exactly one input.

According to an alternative embodiment, the apertures having electrodes controlled by the second group of stages is a subset of the apertures having electrodes controlled by the first group of stages. In such embodiment, one shift register controlling plural apertures may have more than one inputs, wherein a subset of stages dependent from one input is also dependent on another input.

According to a particular embodiment herein, the electrodes of all apertures of the group of apertures are controlled by the stages of one single shift register.

According to a further exemplary embodiment, the shift registers are provided on the multi-aperture plate. According to a particular embodiment herein, the shift registers are disposed between adjacent apertures such that a pattern of the apertures is interlaced with a pattern of circuits providing the function of the shift registers.

The inputs of the shift registers may be supplied with input signals in various ways. According to an exemplary embodiment, the input signals are supplied to the inputs by electrical conductors connected to a controller generating the input signals and disposed at a distance from the substrate.

According to a further embodiment, the input comprises a light-sensitive element, and a controller for generating the input signals modulates a light beam directed to the light-sensitive element for supplying the input signal to the input.

According to a further exemplary embodiment, the shift registers are provided on a circuit substrate disposed at a distance from the multi-aperture plate.

The electrodes of the apertures can be connected to the outputs of the shift registers in various ways. According to an exemplary embodiment, electrical conductors are used for this purpose. According to an alternative embodiment, the outputs of the stages comprise light emitting elements, and the electrodes have light receiving elements associated therewith, such that light signals generated by the light emitting elements and received by the corresponding light receiving elements control the excitation states of the electrodes.

According to a particular embodiment herein, an imaging optics is provided for imaging a pattern of the light emitting elements on the circuit substrate onto a corresponding pattern of light receiving elements on the multi-aperture plate.

According to an exemplary embodiment, the charged particle beam system comprises a charged particle optics configured to direct the beamlets of charged particles traversing the apertures of the multi-aperture plate onto a charged particle sensitive substrate.

According to an exemplary embodiment herein, the charged particle optics is a de-magnifying or reducing optics allowing to expose the charged particle sensitive substrate with patterns which are significantly smaller than a distance between adjacent apertures on the multi-aperture substrate.

According to a further exemplary embodiment, the charged particle optics comprises a scanning deflector for scanning the plurality of beamlets across the charged particle sensitive substrate in accordance with a clock signal supplied to the shift registers. According to a further exemplary embodiment, a stage for displaceably mounting the charged particle sensitive substrate is moveable relative to the multi-aperture plate.

BRIEF DESCRIPTION OF THE DRAWINGS

The foregoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

Figure 1:
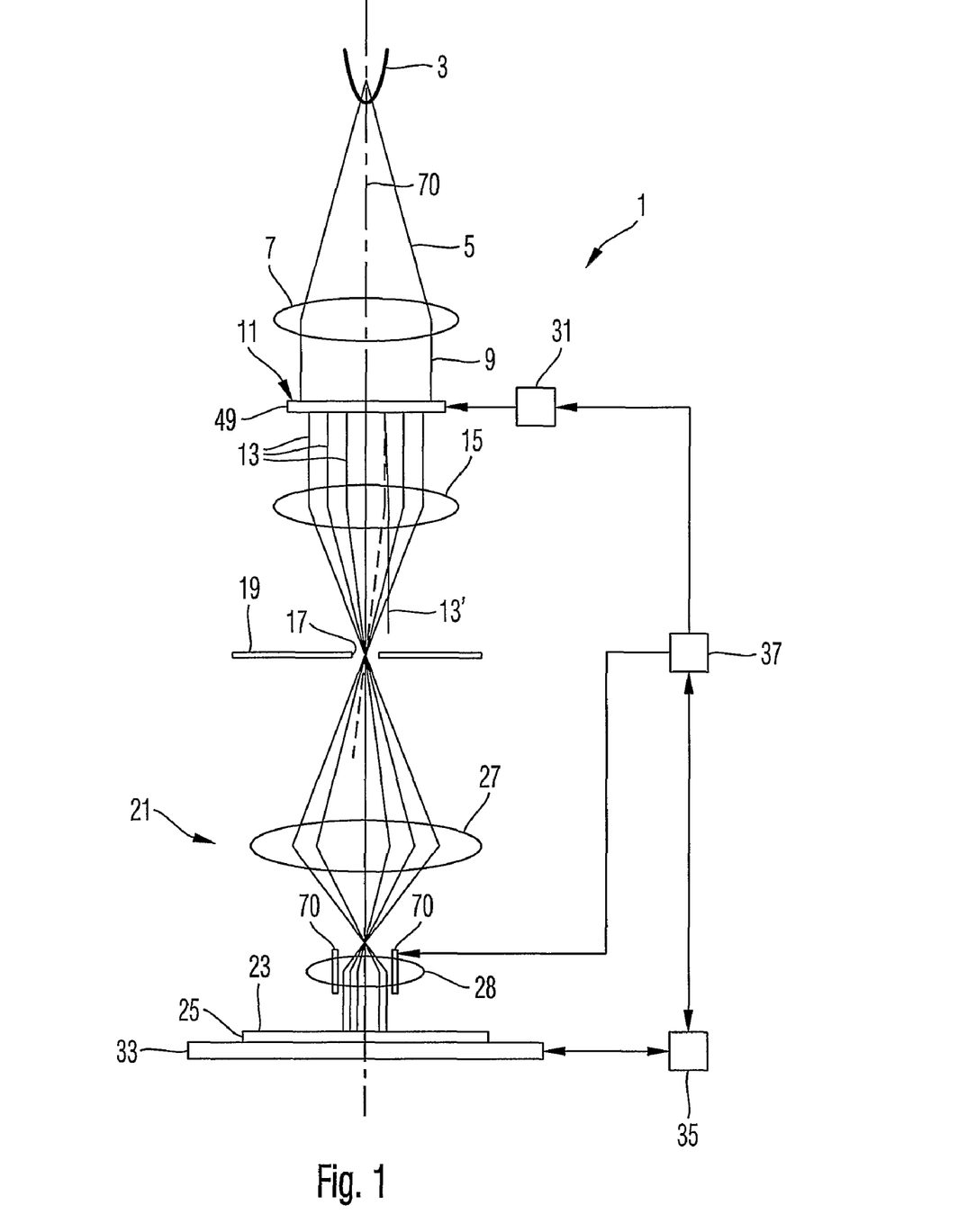
FIG. 1 schematically illustrates a charged particle beam system according to an embodiment of the present invention.

FIG. 1 illustrates a charged particle beam exposure system using a plurality of electron beamlets for exposing a pattern onto a substrate, such as a semiconductor wafer.

The system uses a deflector plate having a plurality of apertures and deflectors associated therewith for individually controlling the plurality of beams. Background information on such types of exposure systems and in particular methods of operations thereof and manufacturing of multi-aperture plates incorporated therein may be obtained from US 2003/0025088 A1, U.S. Pat. Nos. 5,144,142, 5,262,341, 5,814,423 and 6,465,796 B1, the contents of which are incorporated herein by reference.

A charged particle beam exposure system 1 schematically illustrated in FIG. 1 comprises an electron beam source 3 emitting a divergent beam of electrons 5 which is collimated by a suitable lens arrangement 7, such as a magnetic lens arrangement or an electrostatic lens arrangement, to form a parallel beam 9 of electrons which is incident on a beam manipulating arrangement 11.

The beam manipulating arrangement 11 includes a plate defining a plurality of apertures which are traversed by electrons of beam 9 such that a plurality of electron beamlets 13 is formed downstream of the beam manipulating arrangement 11. The schematic illustration of FIG. 1 shows a number of seven beamlets 13 traversing the beam manipulating arrangement 11 for illustrative purposes. In practice, the number of beams 13 is higher, and several hundreds of beams, more than one thousand beams, or even more than one hundred thousand beamlets are formed downstream of the beam manipulating arrangement.

The array of beamlets 13 formed downstream of the beam manipulating arrangement 11 is focused by a lens arrangement 15, traverses a central hole 17 of an aperture plate 19 and is projected by an objective lens arrangement 21 onto a surface 23 of a semiconductor wafer 25. The surface 23 of the semiconductor wafer 25 is covered with a resist which is exposed with the pattern of beamlets 13 having traversed the aperture plate 19. The focusing lens arrangement 15 and the objective lens arrangement 21 are configured such that the beamlets 13 generate a demagnified image of the apertures formed in the beam manipulating arrangement 11. In the schematic representation of FIG. 1, the objective lens arrangement 21 comprises two lenses 27 and 28 for generating the demagnified image. However, the objective lens arrangement may have three or more individual lenses generating plural overlapping electric and magnetic fields. Also the focusing lens 15 may be formed by a magnetic lens arrangement or an arrangement of electrostatic lenses.

As will illustrated in more detail below, each of the apertures provided in the beam manipulating arrangement 11 is associated with a deflector which may be controlled to deflect the beamlet 13 traversing the respective aperture. If the deflector is not energized, the beamlet 13 will traverse the beam manipulating arrangement 11 substantially along a straight line. If the deflector is energized, the respective beamlet traversing the aperture and deflector will be deflected by a sufficient angle such that the beam will not be able to traverse the central hole 17 formed in the aperture plate 19. The schematic illustration of FIG. 1 indicates one such deflected beamlet with reference numeral 13'. Beamlet 13' is intercepted by the aperture plate 19 and is not projected onto the surface 23 of the wafer 15. All other exemplary beamlets 13 shown in FIG. 1 are not deflected by the deflector associated with the respective aperture, and these beamlets are projected onto the surface 23 of the wafer 25.

The deflectors are controlled by a pattern control system 31 such that the individual beamlets 13 reaching the wafer 25 may be selectively switched on and off such that an exposure pattern currently formed on the wafer may be controlled by the pattern control system 31.

The wafer 25 is mounted on a wafer stage 33 which can be displaced relative to the objective lens arrangement 21 by a stage drive control mechanism 35 which is controlled by a main controller 37. The stage drive control mechanism also includes a laser interferometer (not shown in FIG. 1) continuously measuring the position of the stage 33 relative to the other components, such as the objective lens 21, of the exposure system 1, wherein a signal indicative of the current position of a stage 33 and wafer 25 is supplied to the main controller 37.

The charged particle beam exposure system 1 comprises deflectors 70, such as electrostatic deflectors, controlled by the main controller 37 for deflecting the beamlets 13 and thus scanning the pattern of beamlets 13 across the wafer surface 23. The main controller 37 controls the stage drive control mechanism 35, the scanning deflector and the pattern control system 31 such that a desired pattern is exposed onto the wafer surface 23 by continuously moving the wafer 25 relative to the objective lens 21 and selectively switching on and off the beams 13 projected onto the wafer surface 23.

Figure 2:
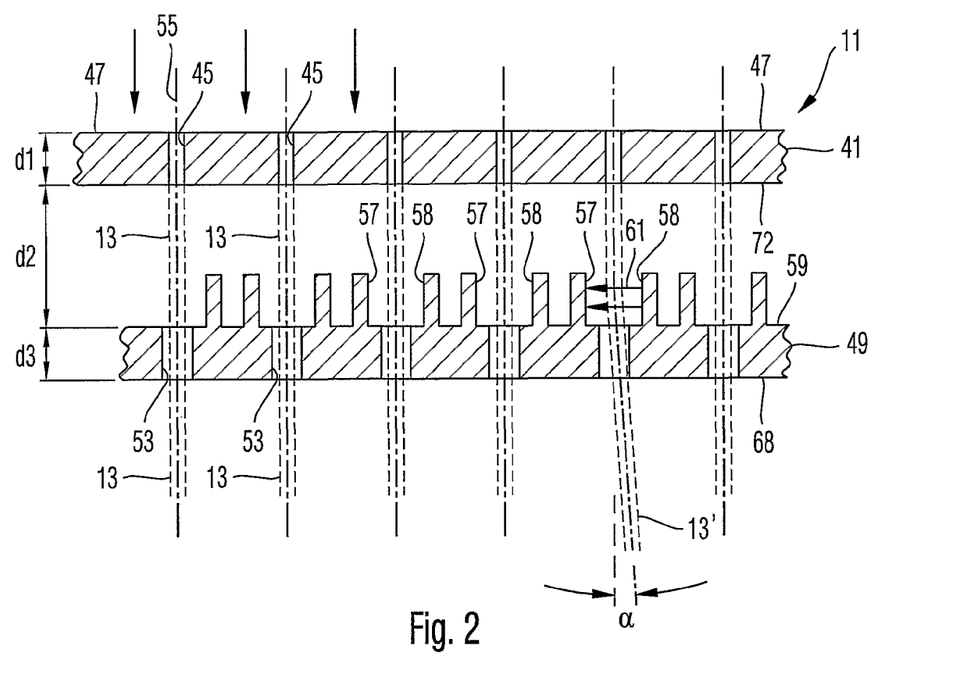
FIG. 2 is an enlarged sectional partial view of a beam manipulating arrangement of the system shown in FIG. 1.

FIG. 2 is a detailed view of the beam manipulating arrangement 11 of the electron beam exposure system 1.

The beam manipulating arrangement 11 comprises a protective plate 41 disposed in a beam path of electron beam 9. The protective plate 41 is made of a monocrystalline silicon substrate 12 and has a central portion 43 having a thickness $d_1$ of about 20 μm to about 50 μm. The central portion 43 defines a plurality of apertures 45 or through-holes having an inner diameter of about 5 μm in the present example. The electrons of electron beam 9 are either absorbed by the upper surface 47 of the protective plate 41 or traverse the through-holes 45 to form the plurality of beamlets 13 downstream of the protective plate 41. A deflector plate 49 having a central portion 51 of a thickness $d_3$ of about 50 μm in the present example is disposed downstream of the central portion 43 of protective plate 41 such that a gap of a width $d_2$ of about 1000 μm in the present example is formed between the central portions 43, 51 of the protective plate 41 and deflector plate 49. The deflector plate 49 has a plurality of apertures 53 which are registered to the apertures 45 of the protective plate such that each pair of apertures 45 and 53 has a common central axis 55. The apertures 53 have a diameter of about 7 μm in the present example which is larger than the diameter of apertures 45 of the protective plate such that the beams 13 formed by the apertures 45 will traverse the apertures 53 of the deflector plate 49 without any contact with side walls of the apertures 53.

Additional through-holes (not shown in FIG. 2) may be formed in the deflector plate 49 and/or the protective plate 41. The additional holes are disposed outside of the region where the electron beam 9 is incident on the protective plate 41 and have a function of improving a vacuum in the gap formed between the protective plate 41 and the deflector plate 49. For this purpose, the additional apertures may have a greater diameter than the apertures 45 and 53 traversed by the electron beams 13. For example, plural additional through-holes of a diameter of 100 μm may be formed to have a total area of about 1 mm² to 100 mm².

The deflector plate 49 carries a plurality of beamlet manipulating electrodes 57, 58 extending from an upper surface 59 of the central portion 51 of the deflector plate 49 into the gap formed between the deflector plate 49 and the protective plate 41. Each aperture 53 has a pair of electrodes 57, 58 associated therewith and contacted to a switching circuitry such that an electrical field indicated by arrows 61 in FIG. 3 may be selectively generated between each pair of electrodes 57, 58.

Figure 3:
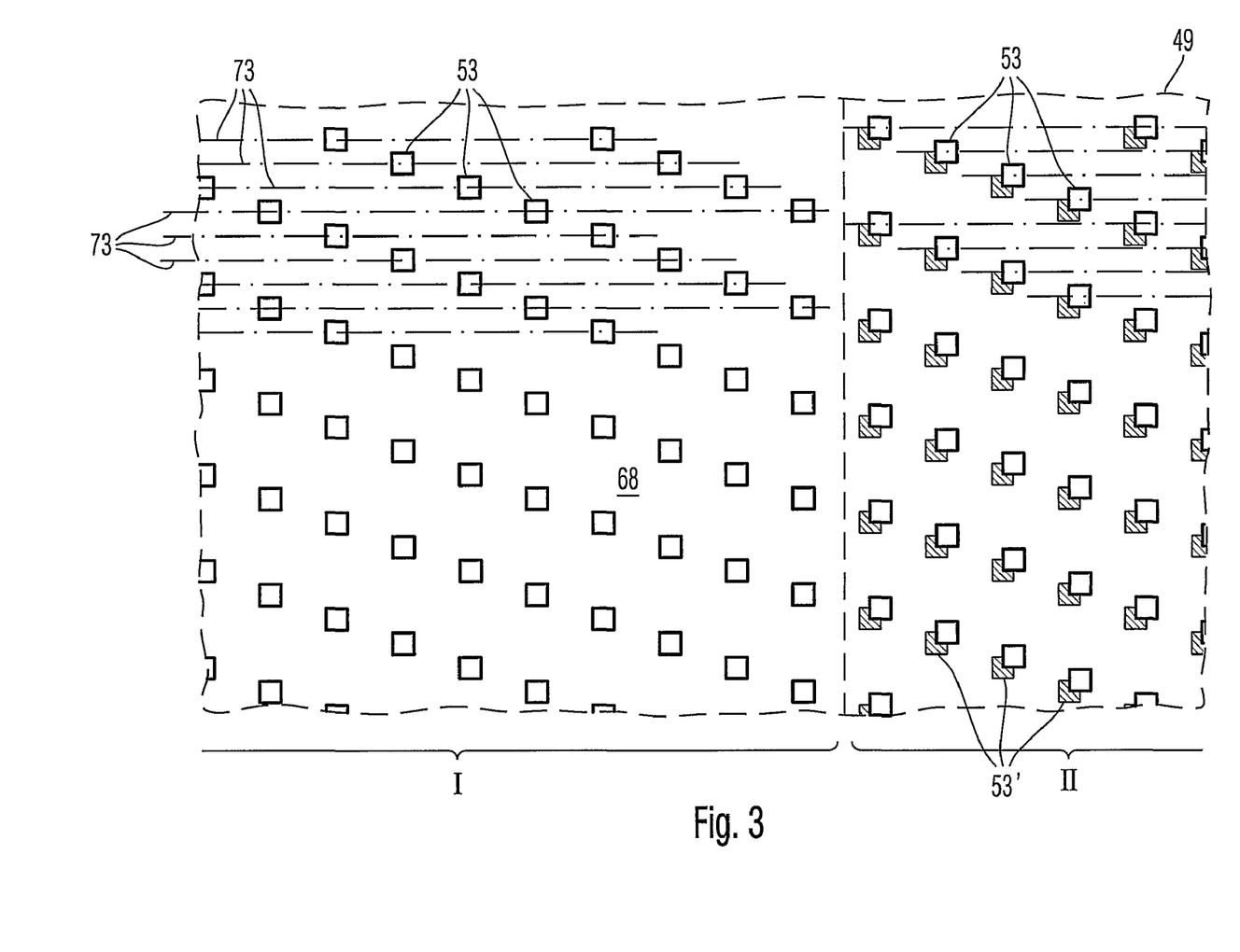
FIG. 3 is an elevational view of a portion of the beam manipulating arrangement shown in FIG. 2.

The electrical field 61 deflects the electron beamlet 13' by an angle α relative to the common axis 55 of apertures 45 and 53. The deflection angle α is sufficient to prevent that beamlet 13' traverses the hole 17 of aperture plate 19 and, thus, the beamlet 13' does not contribute to generating the exposure pattern on the wafer surface 23. The beams 13 traversing electrodes 57, 58, between which the electrical field is not switched on, will traverse the apertures 53 along the common axis 55 substantially without deflection. These beamlets 13 will traverse the central hole 17 of aperture plate 19 and contribute to generating the exposure pattern on the wafer surface 23.

FIG. 3 is an elevational view of a portion of a bottom surface 68 of multi-aperture plate 49. FIG. 3 indicates a region I in which the apertures 53 are disposed according to a regular pattern. In region I, the apertures 53 are disposed in an array having plural columns and plural lines. Plural apertures are disposed along straight lines 73, wherein distances between adjacent lines are constant and wherein distances between adjacent columns are constant and wherein the apertures of adjacent lines 73 are shifted from line to line by a distance corresponding to a distance between adjacent columns and corresponding to two times a width of the apertures 53 in a direction of the lines 73.

In the region II of FIG. 3, the apertures 53 are disposed according to a same pattern as that of region I, wherein the pattern of region II is shifted relative to a regular extension of the pattern of region I by a shifting amount of one half of the aperture width to the right and to the top. For ease of illustration, the pattern conforming with the regular extension of the pattern of region I is indicated by shaded squares 53' in region II.

The multi-aperture plate 49 comprises further regions (not shown in FIG. 3) in which the pattern arrangement is shifted relative to the arrangement in region I by an amount of half the aperture width to the top left, bottom left and bottom right, respectively. With such arrangement of apertures 53 on the multi-aperture plate 49, it is possible to generate a high resolution exposure pattern on the surface 53 of the wafer 25.

Figure 4:
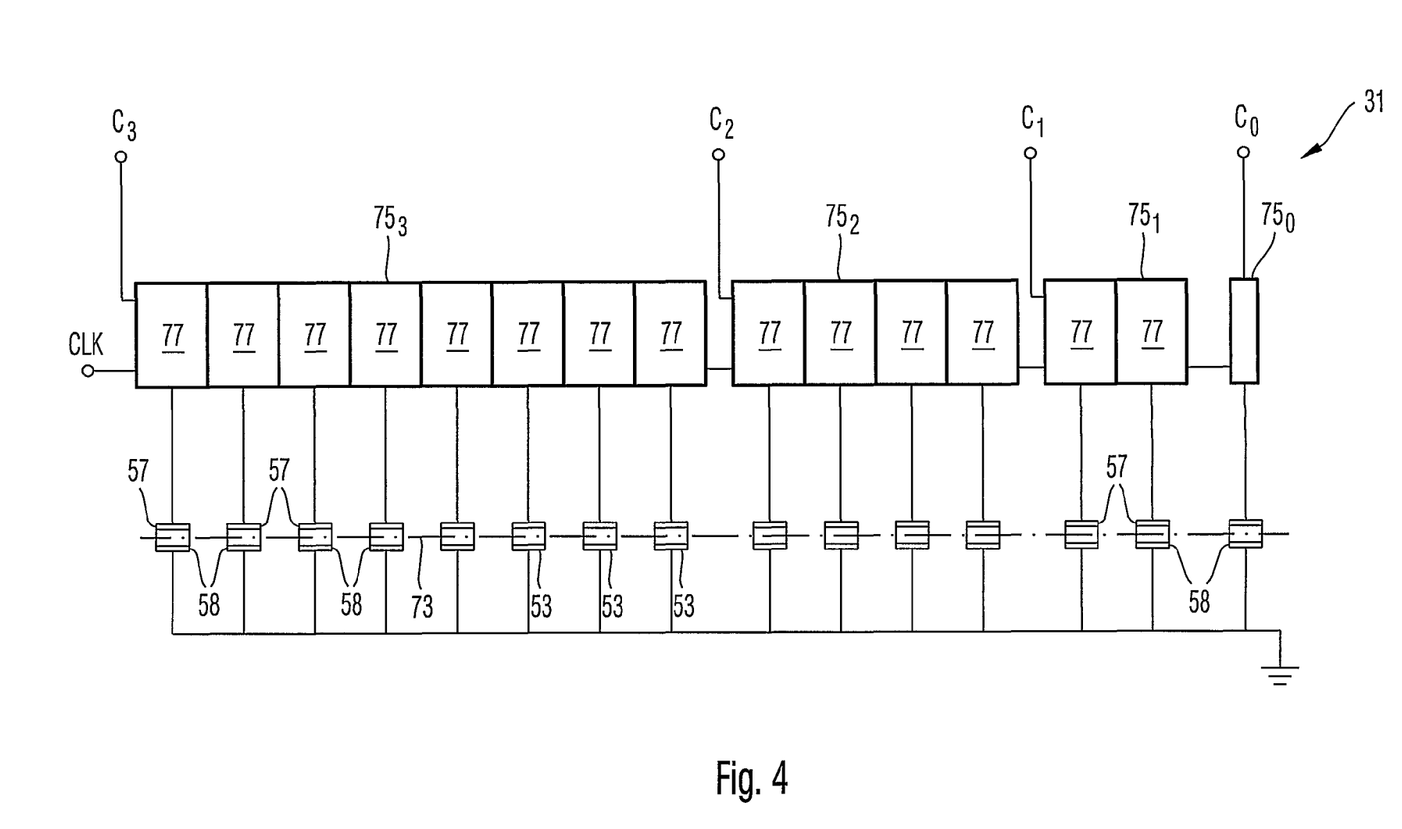
FIG. 4 is a schematic illustration of a line of apertures of the arrangement shown in FIG. 3 connected to plural shift registers.

FIG. 4 illustrates how apertures 53 are controlled by the pattern control system 31. A group of fifteen apertures 53 is disposed along each line 73 in FIG. 3. Each of electrodes 58 of the apertures 53 is connected to a common ground, and the other electrodes 57 are individually controlled by output stages of a single register $75_0$ and shift registers $75_1$, $75_2$, and $75_3$. Shift register $75_1$ has two stages 77, shift register $75_2$ has four stages, and shift register $75_3$ has eight stages 77. All shift registers $75_1$, $75_2$, $75_3$ and their stages are supplied with a common clock signal CLK.

Without any input signals applied to the inputs $C_0$, $C_1$, $C_2$, $C_3$, a deflecting voltage is applied to the electrode 57 such that the beamlets traversing the apertures 53 are deflected and do not contribute to the exposure of the resist.

If an exposure signal is supplied to input $C_3$ of register $75_3$ a non-deflecting voltage, i.e. ground in the present example, is applied to the electrode 57 connected to the first (left) stage 77 of shift register $75_3$ with the next leading edge of the clock signal. In the next clock period, the non-deflecting voltage is applied to the electrode 57 connected to the second stage 77 of the shift register $75_3$, while the electrode 57 connected to the first stage 77 is supplied with a voltage conforming with an input state of input $C_3$ within the next clock period, i.e. the electrode is supplied with the non-deflecting voltage if the input signal is supplied to input $C_3$, and ground potential is supplied to electrode 57 if the input signal is not supplied to the input $C_3$ in the next clock period.

With the next clock period, the third stage 77 from the left of shift register 53 supplies the non-deflecting voltage to the electrode 57 of the corresponding aperture 53 and so on, until the non-deflecting voltage is supplied to the eighth (right) stage 77 of the shift register $75_3$ after eight clock periods.

Since eight apertures 53 are connected to the shift register $75_3$ these eight apertures are dependent on input signals supplied to the input $C_3$ of the shift register $57_3$. The other apertures 53 of the line 73, which are connected to the registers $75_0$, $75_1$ and $75_2$ rather than the shift register $75_3$ are not dependent on input signals supplied to the input $C_3$. However, among these remaining seven apertures 53, there is a number of four apertures 53 which is connected to the group of four stages 77 of the shift register $75_2$, and these apertures are dependent on input signals supplied to the input $C_2$ of the shift register $75_2$. Similarly, two apertures 53 are connected to the group of two stages 77 of the shift register $75_1$, and these two apertures are dependent on input signals supplied to the input $C_1$ shift register $75_1$. Finally, the single aperture 53 disposed most right on the line 73 shown in FIG. 4 is dependent only when input signals are supplied to the input $C_0$ of the register $75_0$ which then supplies the non-deflecting voltage to the electrode 57 of the most right aperture 53 in accordance with the next rising edge of the clock signal.

With such arrangement of a portion of the pattern control system 31, it is possible to expose a location on the substrate surface 23 with an exposure dose corresponding to fifteen unit doses if an input signal is supplied to input $C_3$ in a first clock period, an input signal is supplied to the input $C_2$ in a ninth clock period after the first clock period, an input signal is supplied to the input $C_1$ in a thirteenth clock period after the ninth clock period and the input signal is supplied to the input $C_0$ in a fifteenth clock period after the thirteenth clock period. Thus, each of the beamlets traversing the apertures 53 of the line 73 is subsequently deflected to the exposing state where it reaches the substrate surface 23, and since the beamlets are scanned by the deflectors 70 in synchronism with the clock signal, one location on the substrate surface 53 is subsequently exposed by exposure unit doses of the beamlets traversing the fifteen apertures 53 of the line 73.

If the pattern of input signals supplied to the inputs $C_0$, $C_1$, $C_2$ and $C_3$ is modified, for example such that the above illustrated input signals are supplied only to the inputs $C_0$, $C_1$ and $C_2$, the same location will be exposed to only seven unit doses. If, for example, the input signal according to the timing illustrated above was only supplied to inputs $C_1$ and $C_3$, the location will receive an exposure of ten unit doses.

Since each number of apertures 53 of the line 73 connected to one group of stages 77 corresponds to a power of two, i.e. 1, 2, 4, 8, each integer multiple of the unit dose between one and fifteen can be supplied to each location on the surface 23. no input signal is supplied to the inputs $C_0$, $C_1$, $C_2$ and $C_3$ within the timing illustrated above, the corresponding location on the substrate surface 23 will receive no exposure at all.

Figure 5:
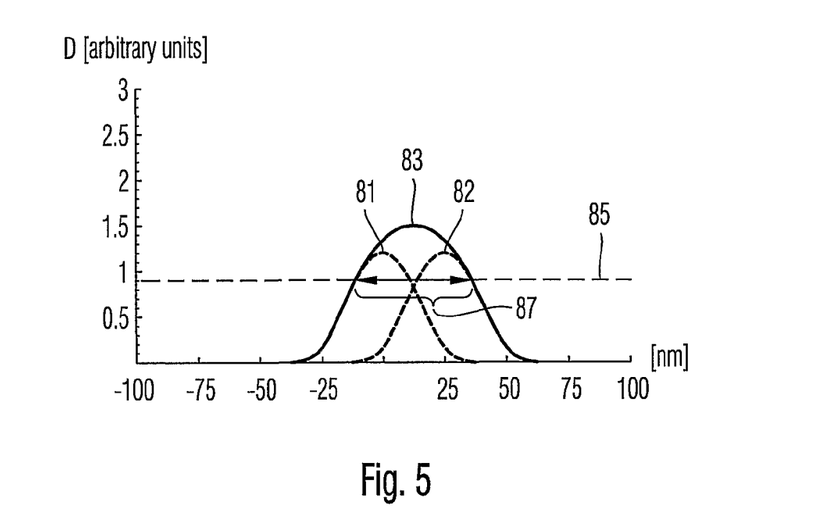
FIG. 5 is an exemplary representation of an exposure dose distribution generated with the charged particle beam system shown in FIG. 1.

FIG. 5 is an exemplary illustration of an exposure dose D distribution applied to the resist on wafer surface 23 assuming that two adjacent locations are exposed to a same dose of, for example, 10 unit doses. Due to a particle intensity distribution across the beamlet, a dose distribution 81 supplied to a first location is of a bell-shape similar to a Gaussian distribution, and a dosed distribution 82 applied to an adjacent location 25 nm away from the first location is of a similar bell-shape. A line 83 in FIG. 5 illustrates the combined integral dose distribution resulting from the sum of distributions 81 and 82. A line 85 in FIG. 5 represents a threshold dose of the resist which means that a region 87 of the resist in which the integral dose 83 exceeds the threshold is an exposed state, and regions outside of regions 87 of the resist are in a non-exposed state. The exposed region 87 has a width of about 45 nm.

It is apparent from FIG. 5 that it is possible to increase the width of the exposed region 87 by a small amount, such as 5 nm, if either or both of the intensity distributions 81 and 82 is increased by a suitable amount of unit doses. Further, the exposed region 87 may be shifted to the left or to the right by some small amount if one of the distributions 81 and 82 is reduced and the other is increased by a suitable amount of unit doses.

Thus, it is apparent that positions and widths of exposed regions 87 on the wafer may be controlled by relatively small amounts as compared to the distance of 25 nm between adjacent beamlets.

Figure 6:
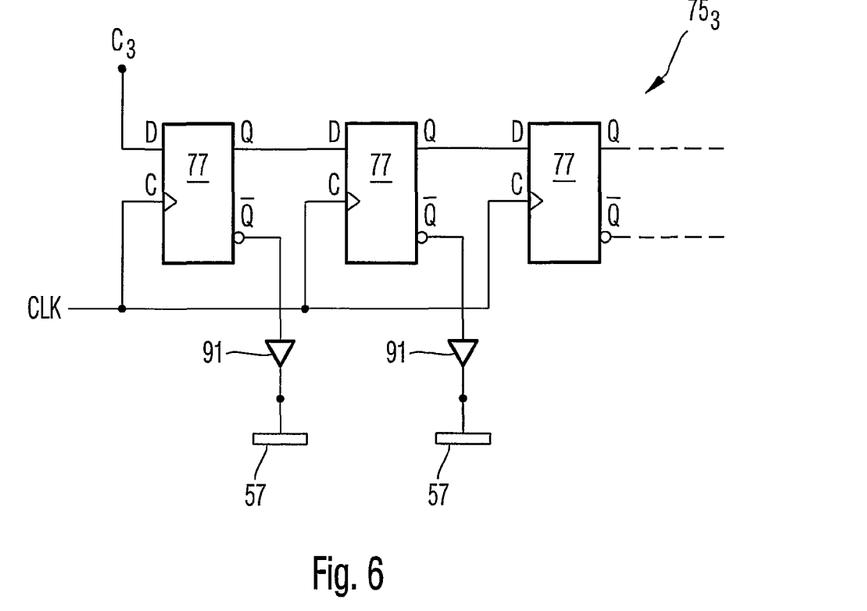
FIG. 6 is a schematic illustration of a circuit portion of a shift register shown in FIG. 4.

FIG. 6 is a more detailed illustration of the left three stages 77 of shift register 75₃. Each stage comprises a D-flip-flop having a clock input C, a data-in D, an output Q and a negated output Q'. The data-in D of the left stage 77 is connected to the input $C_3$ of the shift register 75₃, and the output Q of each of the stages 77 is connected to the data-in D of the stage 77 next right to it. The negated outputs Q' are connected to drivers 91 supplying deflection voltages to the respective electrodes 57 in states where no input signal is supplied to the input $C_3$ and corresponding data-in D of the stages 77, such that the beamlets are deflected and will not reach the substrate surface 23. If input signals are supplied to the data-in D of the stages 77, the negated output Q' controls the drivers 91 such that the non-deflecting voltage is applied to the electrode 57, resulting in that the beamlet will be not deflected by the pairs of electrodes 47, 48 and reach the substrate surfaces 53 and expose the resist with a unit dose during one clock cycle. The shift registers 75 of the present embodiment are provided on substrate surface 59 of multi-aperture plate 49 in regions of the surface 59 between the apertures 53 and deflectors 57, 58. The inputs $C_0$, $C_1$, $C_2$ and $C_3$ are supplied to the respective stages 77 by electrically conducting data lines provided on the surface 59. The input signal supplied to the inputs $C_0$, $C_1$, ... of the apertures of each line 73 are generated by a portion of the pattern control system 31 disposed outside of a vacuum chamber in which the electron optics and beam manipulating arrangement is disposed.

Figure 7:
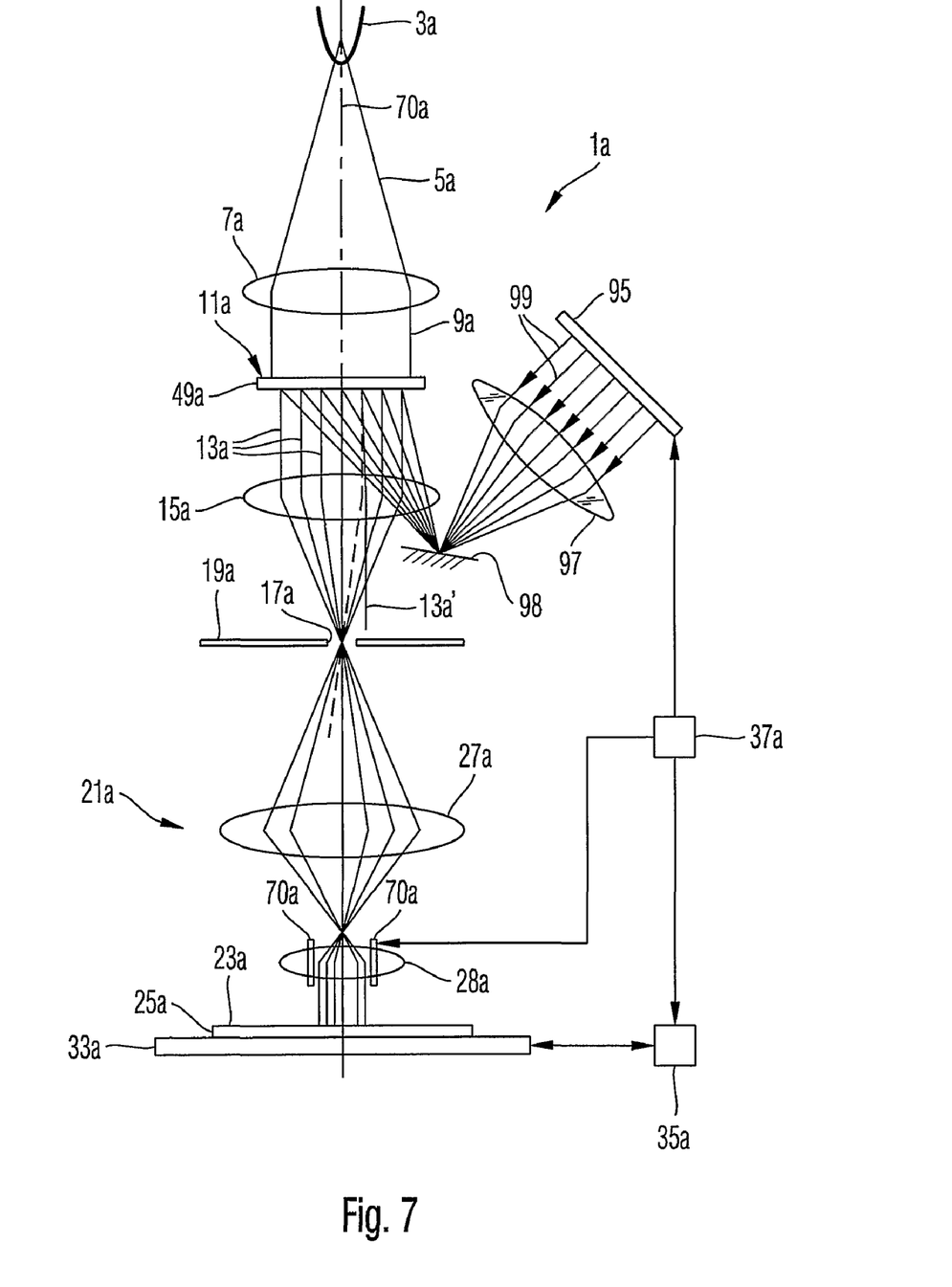
FIG. 7 schematically illustrates a charged particle beam system according to a further embodiment of the present invention.

FIG. 7 illustrates an embodiment of a charged particle beam exposure system 1a which is similar to the system illustrated with reference to FIGS. 1 to 6 above, but has a plurality of lines of shift registers formed on a circuit substrate 95 disposed at a distance from the beam manipulating arrangement 11 and its multi-aperture plate 49a. The configuration of the shift registers provided on circuit substrate 95 is similar to that illustrated above with respect to the multi-aperture plate. However, referring to FIG. 4, a light generating element, such as a LED, is connected to the stages of the shift registers provided on the circuit substrate 95.

Each of the electrodes 57 on the multi-aperture plate 59 has a light receiving element, such as a photo-diode, associated therewith, such that a deflection voltage is applied to the respective electrode 57 depending on whether the photo-sensitive element receives light or not.

The light generating elements on the circuit substrate are arranged in a pattern conforming to an arrangement patter of the light receiving elements on the multi-aperture plate 49a. An imaging optics comprising one or more lenses 97 and a mirror 98 is provided for imaging the arrangement pattern of the light generating elements on the circuit substrate 95 onto the arrangement pattern of the light receiving elements on the multi-aperture plate 49 such that light beams 99 generated by the light generating elements on the circuit substrate 95 are used for controlling the deflection states of the beamlets traversing the apertures of the multi-aperture plate 49a.

With such arrangement, it is possible to avoid complicated implementing of shift registers on the multi-aperture plate and associated wiring. Further, the circuit substrate 95 may be disposed outside of a vacuum chamber of the exposure system 1a, and the light beams 99 may enter into the vacuum system to be incident on the multi-aperture plate 49a through a window of the vacuum system.

A further embodiment of a charged particle beam exposure system will be illustrated with reference to FIG. 8 below.

Figure 8:
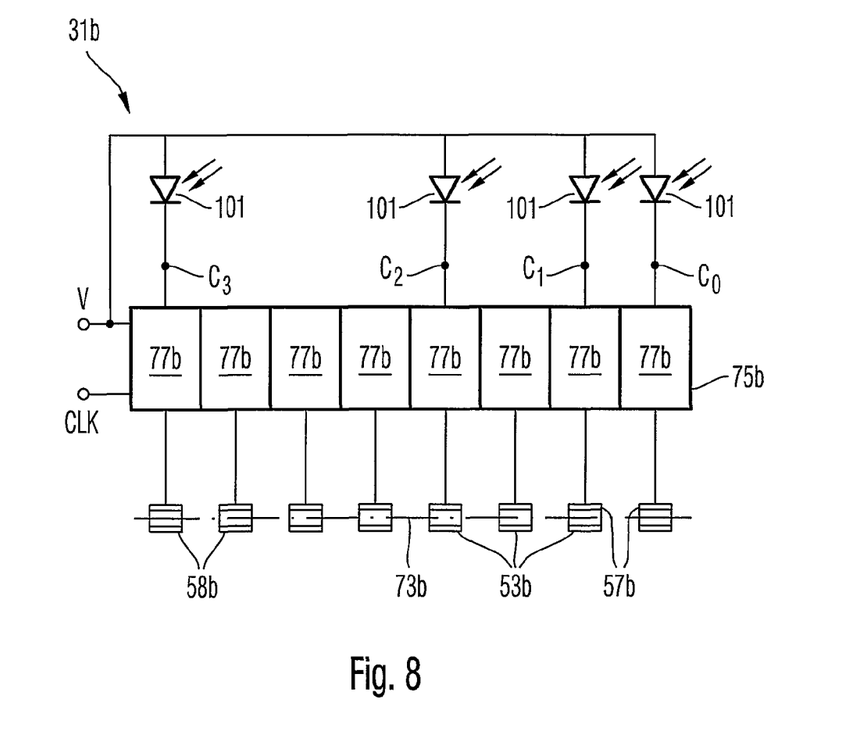
FIG. 8 is a schematic illustration of a still further embodiment of a charged particle beam system having apertures disposed in a line controlled by a shift register having plural inputs.

FIG. 8 shows a portion of a pattern control system 31b for controlling a group of apertures 53b disposed on a line 73b. The eight apertures 53b disposed on the line 73b are controlled by eight stages 77b of one single shift register 75b. The shift register 75b has inputs $C_0$, $C_1$, $C_2$, $C_3$, wherein the input $C_3$ is connected to the most left stage 77b, the input $C_2$ is connected to the fifth stage 77b from the left, the input $C_1$ is connected to the seventh stage 77b from the left, and the input $C_0$ is connected to the eight stage 77b from the left, which is the most right stage of the shift register 74b.

The additional inputs $C_2$ and $C_1$ to the shift register 75b can be implemented, for example, by connecting the inputs $C_2$, $C_1$ to connections between Q and D between adjacent stages of the shift registers shown in FIG. 6. Moreover, the additional inputs, such as $C_2$ and $C_1$, can be connected to comperators or other circuitry connected in-between output Q and data-in D between adjacent stages. Further, additional inputs can be provided between adjacent stages for inputting a stop signal which blocks a shift operation propagating between adjacent stages. Such additional inputs can be used to further adjust intensities to which a particular location on the wafer is exposed.

In this embodiment, the most right stage is dependent on input signals supplied to each of inputs $C_0$, $C_1$, $C_2$, $C_3$, since the shift direction of the shift register 75b is to the right. The seventh stage from the left is dependent on input signal supplied to the inputs $C_1$, $C_2$ and $C_3$, and it is independent from the input $C_0$. Similarly, the first to the sixth stages are independent of input signal supplied to inputs $C_0$ and $C_1$, and the first to fourth stages are independent from input signals supplied to inputs $C_0$, $C_1$ and $C_2$. Thus, a group of eight stages is dependent from input $C_3$, a group of four stages, which is a subset of the eighth stages dependent on $C_3$, is dependent from input $C_2$, a group of two stages, which is a subset of the four stages dependent on $C_2$, is dependent on $C_1$, and a group comprising only the right most stage, which is also a subset of the two stages dependent on $C_1$, is dependent on $C_0$. By supplying an input signal to the input $C_3$ at a first clock cycle, the corresponding location on the wafer surface will receive eight dose units, by supplying an input signal to the input $C_2$ five cycles later, will generate an exposure dose of four exposure units at the same location. Further, two dose units or one dose unit can be generated at this location by supplying an input signal to the input $C_1$ six clock cycles later or to the input $C_0$, respectively, seven clock cycles later.

Also with this embodiment it is possible to adjust an exposure dose exposed to a location of the wafer. However, since the groups of stages dependent from individual inputs are overlapping groups or subsets of each other provided in one single shift register, it is not possible to adjust the exposure dose in integer multiples of the unit dose as this was possible in the embodiment with reference to FIGS. 1 to 6 above.

FIG. 8 further shows that light receiving elements 101 are connected to each of the input $C_0$, $C_1$, $C_2$ and $C_3$ allowing for controlling the apertures 53b by light beams generated by corresponding light emitting elements provided on a circuit substrate spaced apart from the multi-aperture plate. Thus, in this embodiment, the shift registers are provided on the multi-aperture plate, but the supply of input signals to the shift register is performed by optical beams. The circuit substrate carrying the light emitting elements may be disposed outside of a vacuum chamber wherein the optical beams enter the vacuum chamber where the multi-aperture plate is disposed through a window.

While the embodiment illustrated with reference to FIG. 4 has one single input provided to each of plural shift registers and the embodiment illustrated with reference to FIG. 8 has plural inputs provided to one single shift register, it is possible to combine both embodiments to an embodiment having plural shift registers for controlling the apertures disposed along one line, wherein one or more of the plural shift registers has more than one input.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. A charged particle beam system, the system comprising:
    a charged particle source for generating at least one beam of charged particles;
    a multi-aperture plate having a plurality of apertures;
    charged particle optics configured to direct beamlets of charged particles traversing the apertures of the multi-aperture plate onto a charged particle sensitive substrate;
    a plurality of beamlet manipulating electrodes, wherein each aperture has at least one beamlet manipulating electrode associated therewith for modulating the beamlet traversing the aperture; and
    a control system comprising a plurality of shift registers, each shift register having at least one input and plural stages, wherein the at least one beamlet manipulating electrode of each aperture is controlled by at least one stage of the shift registers in dependence of an output state of the at least one stage;
    wherein each input has a group of stages associated therewith, wherein the output states of only the stages of the group of stages are dependent on states of the respective input;
    wherein the plurality of apertures comprises plural groups of apertures, wherein the apertures of each group of apertures are disposed on the multi-aperture plate along a straight line;
    wherein the electrodes of the apertures of each group of apertures are controlled by stages of plural groups of stages,
    wherein a number of apertures having electrodes controlled by a first group of the plural groups of stages differs from a number of apertures having electrodes controlled by a second group of the plural groups of stages.

2. The charged particle beam system according to claim 1, wherein the number of the apertures having electrodes controlled by the first group of stages is greater than five times the number of the apertures having electrodes controlled by the second group of stages.

3. The charged particle beam system according to claim 1, wherein the electrodes of the apertures of each group of apertures are controlled by stages of at least three groups of stages, wherein the number of the apertures having electrodes controlled by one group of stages is different for each of the at least three groups of stages.

4. The charged particle beam system according to claim 3, wherein the number of the apertures having electrodes controlled by one group of stages is an integer multiple of a power of 2.

5. The charged particle beam system according to claim 1, wherein the electrodes of each aperture are controlled by only one group of stages.

6. The charged particle beam system according to claim 1, wherein each shift register has exactly one input.

7. The charged particle beam system according to claim 1, wherein the apertures having electrodes controlled by the second group of stages is a subset of the apertures having electrodes controlled by the first group of stages.

8. The charged particle beam system according to claim 7, wherein the electrodes of all apertures of the group of apertures are controlled by the stages of one single shift register.

9. The charged particle beam system according to claim 1, wherein the stages controlling the electrodes of the apertures of the group of apertures are supplied with a common clock signal.

10. The charged particle beam system according to claim 1, wherein the shift registers are provided on the multi-aperture plate.

11. The charged particle beam system according to claim 10, wherein the input of the shift register is connected to a photosensitive element.

12. The charged particle beam system according to claim 1, wherein the shift registers are provided on a circuit substrate disposed at a distance from the multi-aperture plate.

13. The charged particle beam system according to claim 12, wherein the control system comprises a plurality of electrical conductors extending from the circuit substrate to the multi-aperture plate, wherein each of the electrical conductors is connected to an output of a stage of a shift register.

14. The charged particle beam system according to claim 1, wherein the charged particle optics comprises a de-magnifying optics, such that a distance between adjacent beamlets incident on the charged particle sensitive substrate is smaller than a distance between adjacent beamlets traversing the multi-aperture plate.

15. The charged particle beam system according to claim 1, wherein the charged particle optics comprises a scanning deflector for scanning the plurality of beamlets across the charged particle sensitive substrate.

16. The charged particle beam system according to claim 1, further comprising a stage for displaceably mounting the charged particle sensitive substrate relative to the charged particle optics.

17. The charged particle beam system according to claim 16, wherein the charged particle optics comprises a scanning deflector for scanning the plurality of beamlets across the charged particle sensitive substrate in a direction transverse to a direction of displacement of the charged particle sensitive substrate relative to the charged particle optics.

* * * * *